United States Patent [19]

Pham

[11] 4,320,314
[45] Mar. 16, 1982

[54] SEQUENTIAL LOGIC ELEMENT

[75] Inventor: Ngu T. Pham, Paris, France

[73] Assignee: Thomson-CSF, Paris, France

[21] Appl. No.: 104,549

[22] Filed: Dec. 17, 1979

[30] Foreign Application Priority Data

Dec. 19, 1978 [FR] France ............................... 78 35636

[51] Int. Cl.³ ...................... H03K 3/288; H03K 3/352
[52] U.S. Cl. ................................ 307/288; 307/247 R;
307/252 G
[58] Field of Search ............... 307/288, 252 A, 252 C,
307/252 G, 220 B, 221 B, 222 B, 223 B, 224 B,
225 B, 247 R

[56] References Cited

U.S. PATENT DOCUMENTS

| | | | |
|---|---|---|---|
| 2,957,091 | 10/1960 | Pace | 307/288 |
| 3,237,021 | 2/1966 | Jenkins | 307/288 |
| 4,031,413 | 6/1977 | Ohhinata et al. | 307/288 X |

Primary Examiner—John Zazworsky
Attorney, Agent, or Firm—Oblon, Fisher, Spivak, McClelland & Maier

[57] ABSTRACT

An integrated sequential logic element of the p-n-p-n type ($TT_2$) having two complementary transistors and forming a flip-flop. The input of the flip-flop is connected to the output of an analog gate ($TT_1$) having an input controlled by a timing signal (H) permitting the blocking or unblocking thereof and an input (E) receiving a voltage with two levels able to change the flip-flop from one state to the other if the timing signal input is not connected to earth.

3 Claims, 3 Drawing Figures

SEQUENTIAL LOGIC ELEMENT

BACKGROUND OF THE INVENTION

The invention relates to a sequential logic element and in particular to a synchronizable flip-flop. The significance of such elements is that they can easily be realised in integrated circuits. However, such structures are relatively complicated, which limits their integration density.

BRIEF SUMMARY OF THE INVENTION

The present invention relates to an integrated sequential logic element with very small dimensions.

This element has an analog gate, whose output is connected to the single input of flip-flop. The gate is controlled by a timing signal.

The sequential logic element with a memory according to the invention comprises:
- a first, a second and a third transistor, constituting a first, a second and a third steady current source;
- an analog gate constituted by a p-n-p-n or n-p-n-p-type structure formed by a fourth and a fifth complementary transistor, one of these being of the lateral type and the other of the transverse type, whose input is the emitter of the fifth transistor and whose output is the collector of the fifth transistor, the emitter of the fourth transistor being connected to the first steady current source and to the input of the timing signal;
- a flip-flop constituted by a sixth and a seventh complementary transistor, one being of the lateral type and the other of the transverse type, the emitter of the sixth transistor being connected to the second steady current source, the base of the sixth transistor and the collector of the seventh transistor being connected to the third steady current source and to one pole of a diode, the input of the flip-flop being constituted by the region common to the base of the seventh transistor and to the collector of the sixth transistor and connected to the output of the analog gate, the emitter of the seventh transistor being connected to earth and the output of the said flip-flop being connected to the collector of the seventh transistor across the said diode.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
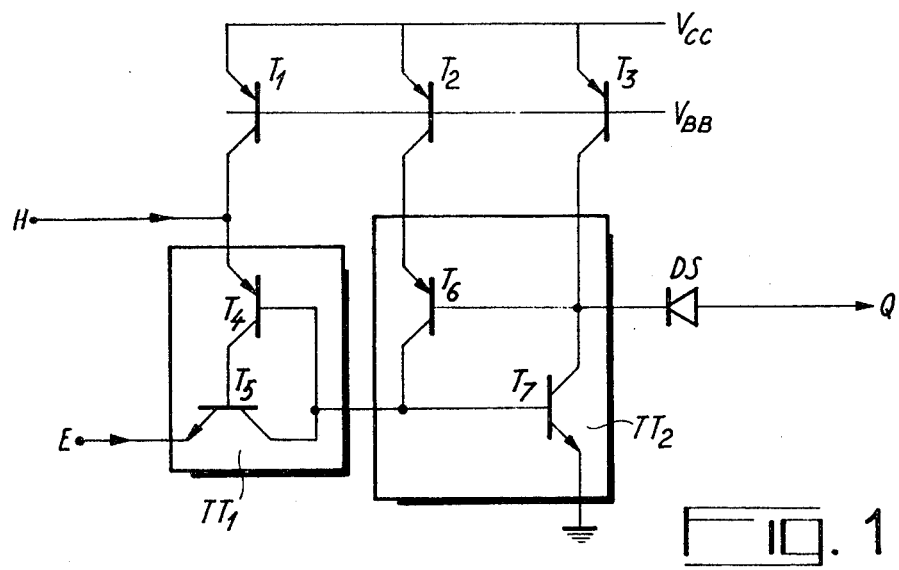
FIG. 1 diagrammatically an embodiment of the element according to the invention.

FIG. 1 shows three p-n-p transistors $T_1$, $T_2$, $T_3$, whose respective emitters are connected to the same polarization source $V_{CC}$, whilst their bases are connected to the polarization source $V_{BB}$. These three transistors act as steady current sources. The collector of transistor $T_1$ is connected to the emitter of a p-n-p transistor $T_4$, which with a complementary n-p-n transistor $T_5$ forms a p-n-p-n structure $T T_1$ of the type encountered in integrated injection logics ($I_2L$) or in twin transistor logics ($T_2L$). As is known in the case of such transistors the base of the first transistor and the collector of the second transistor form a same semiconducting region, whilst the collector of the first transistor and the base of the second form a same semiconducting region forming a rectifier junction with the preceding region. In the first transistor current circulates parallel to the substrate face and in the second perpendicular to said face (lateral and transverse transistors respectively).

Figure 2:
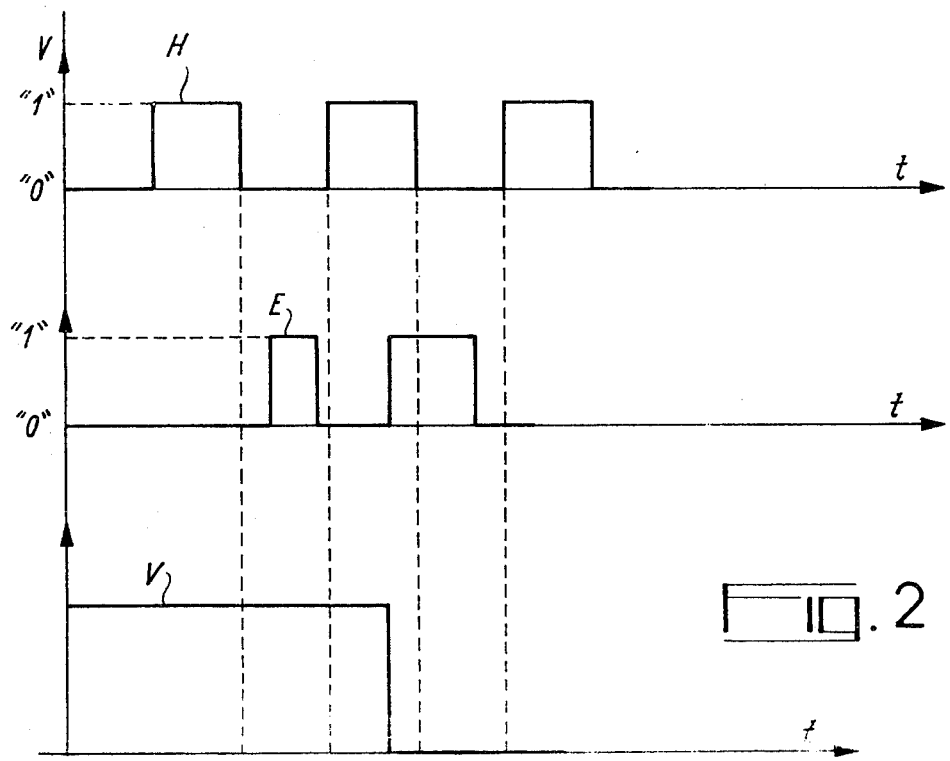
FIG. 2 a group of explanatory curves.

The emitter of transistor $T_4$ is connected to the collector of $T_1$ and to the input H of the timing signals, said square-wave signals alternatively and periodically assuming the level 0 (0 Volt) or the level 1 (positive voltage), as is shown in FIG. 2. The emitter of transistor $T_5$ is connected to the input terminal E which, as required, can assume two potentials, potential 0 or potential 1, said potentials being substantially the same as those of input H, as is also shown in FIG. 2.

The collector of transistor $T_5$ of structure $TT_1$ is connected to the collector of a p-n-p transistor $T_6$, which forms with an n-p-n transistor $T_7$ a structure $TT_2$, which is identical to structure $TT_1$. The emitter of transistor $T_6$ is connected to the collector of transistor $T_2$, whilst its base (as well as the collector of transistor $T_7$ and the collector of transistor $T_3$) is connected to the cathode of a diode DS (Schottky), whose anode is connected to the output Q. The emitter of transistor $T_7$ of structure $TT_2$ is connected to earth.

The system functions in the following manner:

If the emitter of $T_4$ is at earth the current of transistor $T_1$ is closed again on earth. System $TT_1$ is blocked. Whatever the voltage applied to the input E, the latter will have no effect on the state of flip-flop $TT_2$.

If the emitter of $T_4$ is not connected to earth, the structure $TT_1$ is unblocked. In this case if input E is at level 0 structure $TT_2$ is blocked and the output Q, which is isolated from earth, is at level 1. In the same case if input E is at level 1, structure $TT_2$ is unblocked and output Q which is connected to earth will be at level 0.

It is pointed out that when the emitter of $T_4$ is at earth, whatever the levels of input E, flip-flop $TT_2$ does not switch over, no matter whether it is conductive or not.

The signals applied to the input E only change the state of the flip-flop when the emitter of $T_4$ is not connected to earth. This is shown in FIG. 2, more particularly the diagram of the output of the flip-flop as a function of t. The latter only passes to level 0 when the input E is in state 1 at the same time as the timing signal H. Similarly, the output of the flip-flop returns to level V when the input E is in state 0 at the same time as the timing signal.

Figure 3:
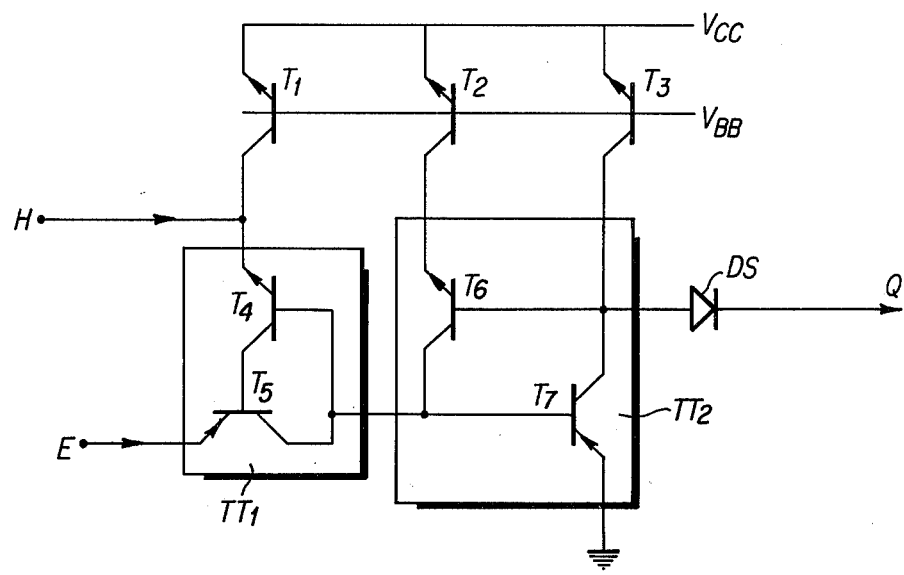
FIG. 3 shows diagrammatically a second embodiment of the invention.

On reversing the type of transistors by replacing the p-n-p transistors by n-p-n transistors, the polarity of signals H and E must be reversed, as must the direction of diode DS, as shown in FIG. 3.

What is claimed is:

1. A sequential logic element with a memory having an analog gate and a flip-flop with a single output, wherein it comprises:
    a first, a second and a third transistor, constituting a first, a second and a third steady current source;
    an analog gate constituted by one of a p-n-p-n and n-p-n-p-type structure formed by a fourth and a fifth complementary transistor, one of these being a lateral type transistor and the other being a transverse type transistor, said analog gate having a first input, a second input and an output, said first input being connected to the emitter of the fifth transistor and said output being connected to the collector of the fifth transistor, the emitter of the fourth transistor being connected to the first steady current source and to said second input, said second input being connected to a source of timing signals;

a flip-flop constituted by a sixth and a seventh complementary transistor, one being a lateral type transistor and the other being a transverse type transistor, said flip-flop having an input, the emitter of the sixth transistor being connected to the second steady current source, the base of the sixth transistor and the collector of the seventh transistor being connected to the third steady current source and to one pole of a diode, the input of the flip-flop being connected to the base of the seventh transistor, to the collector of the sixth transistor and to the output of the analog gate, the base of the seventh transistor and the collector of the sixth transistor having a common region, the emitter of the seventh transistor being connected to earth and the output of said sequential logic element being connected to the other pole of said diode.

2. A logic element according to claim 1, wherein the first, second, third, fourth and sixth transistors are of the p-n-p type and the pole of the diode connected to the output of the flip-flop is the cathode of said diode.

3. A logic element according to claim 1, wherein the first, second, third, fourth and sixth transistors are of the n-p-n type and the sole of the diode connected to the output of the flip-flop is the anode of said diode.

* * * * *